(12) United States Patent
Kimura

(10) Patent No.: US 11,258,195 B2
(45) Date of Patent: Feb. 22, 2022

(54) STORAGE DEVICE AND INFORMATION PROCESSING DEVICE

(71) Applicant: Kioxia Corporation, Minato-ku (JP)

(72) Inventor: Naoki Kimura, Ebina (JP)

(73) Assignee: Kioxia Corporation, Minato-ku (JP)

( * ) Notice: Subject to any disclaimer, the term of this patent is extended or adjusted under 35 U.S.C. 154(b) by 169 days.

(21) Appl. No.: 16/567,174

(22) Filed: Sep. 11, 2019

(65) Prior Publication Data

US 2020/0301617 A1 Sep. 24, 2020

(30) Foreign Application Priority Data

Mar. 20, 2019 (JP) .............................. JP2019-053087

(51) Int. Cl.
*H01R 24/00* (2011.01)
*H01R 12/72* (2011.01)
*H01R 12/70* (2011.01)
*H05K 1/11* (2006.01)
*H05K 5/00* (2006.01)
*G06F 3/06* (2006.01)

(52) U.S. Cl.
CPC ....... *H01R 12/724* (2013.01); *H01R 12/7005* (2013.01); *H05K 1/111* (2013.01); *H05K 1/117* (2013.01); *H05K 5/0065* (2013.01); *G06F 3/0604* (2013.01); *G06F 3/0688* (2013.01); *H05K 2201/10159* (2013.01); *H05K 2201/10189* (2013.01)

(58) Field of Classification Search
CPC ............................ H01R 12/7005; H05K 1/117
USPC ....................................................... 439/633
See application file for complete search history.

(56) References Cited

U.S. PATENT DOCUMENTS

| 3,651,432 | A | * | 3/1972 | Henschen | .............. | H01R 12/75 |
| | | | | | | 333/33 |
| 4,849,944 | A | * | 7/1989 | Matsushita | ............ | G11C 5/143 |
| | | | | | | 714/718 |
| 4,885,482 | A | * | 12/1989 | Sharp | .................... | G06F 13/387 |
| | | | | | | 326/47 |
| 5,024,609 | A | * | 6/1991 | Piorunneck | .......... | H01R 12/721 |
| | | | | | | 439/60 |
| 5,060,369 | A | * | 10/1991 | Date | ...................... | H05K 3/403 |
| | | | | | | 29/830 |
| 5,805,903 | A | * | 9/1998 | Elkhoury | .............. | G06F 13/409 |
| | | | | | | 713/300 |
| 5,963,045 | A | * | 10/1999 | Zink | .................. | G01R 1/07342 |
| | | | | | | 324/750.16 |
| 6,135,781 | A | * | 10/2000 | Pope | ...................... | H01R 24/60 |
| | | | | | | 439/59 |

(Continued)

FOREIGN PATENT DOCUMENTS

JP 2001-36208 A 2/2001

OTHER PUBLICATIONS

"5.3. SSD Socket; Socket 3 (Mechanical Key M)," PCI Express M.2 Specification, Revision 1.0, Nov. 1, 2013, p. 155.

*Primary Examiner* — Neil Abrams
(74) *Attorney, Agent, or Firm* — Oblon, McClelland, Maier & Neustadt, L.L.P.

(57) ABSTRACT

According to one embodiment, a storage device is disclosed. The storage device includes a substrate, a first connector provided on the substrate and including a notch, and a nonvolatile memory provided on the substrate. The storage device further includes a first conductive part provided on the first connector and being adjacent to the notch.

12 Claims, 6 Drawing Sheets

(56) References Cited

U.S. PATENT DOCUMENTS

| | | | |
|---|---|---|---|
| 6,272,021 B1 | 8/2001 | Nagamine et al. | |
| 6,315,614 B1 * | 11/2001 | Hassanzadeh | H05K 7/1431 439/159 |
| 6,529,967 B1 * | 3/2003 | Robertson | G06F 1/189 439/55 |
| 6,634,561 B1 * | 10/2003 | Wallace | G06K 19/07732 235/441 |
| 6,744,634 B2 | 6/2004 | Yen | |
| 6,804,119 B2 * | 10/2004 | Ziemkowski | H01R 13/6485 361/715 |
| 7,172,465 B2 * | 2/2007 | Kinsley | H01R 12/58 439/632 |
| 8,110,751 B2 * | 2/2012 | Kim | H05K 1/117 174/261 |
| 8,353,707 B2 * | 1/2013 | Wang | H01R 13/6658 439/60 |
| 8,371,860 B2 * | 2/2013 | Xiang | H01R 12/721 439/60 |
| 8,456,858 B2 * | 6/2013 | Liang | G06F 1/185 361/785 |
| 8,503,187 B2 * | 8/2013 | Wu | G06F 11/325 361/760 |
| 8,597,056 B2 * | 12/2013 | Blanchfield | H01R 12/732 439/630 |
| 8,708,710 B2 * | 4/2014 | Law | H05K 1/0268 439/60 |
| 8,777,635 B1 * | 7/2014 | Long | H01R 12/7088 439/60 |
| 8,830,683 B2 * | 9/2014 | Cong | G06F 1/189 361/737 |
| 8,979,550 B2 * | 3/2015 | Law | H05K 1/117 439/62 |
| 9,402,309 B2 | 7/2016 | Goodwin | |
| 9,560,760 B2 * | 1/2017 | Wig | H05K 1/0216 |
| 10,320,105 B2 * | 6/2019 | Yun | H05K 1/111 |
| 11,073,873 B1 * | 7/2021 | Sover | G06F 1/186 |
| 2003/0100203 A1 | 5/2003 | Yen | |
| 2004/0266251 A1 * | 12/2004 | Muchlinski | H01R 13/5804 439/439 |
| 2007/0099443 A1 * | 5/2007 | Pax | H05K 1/117 439/55 |
| 2018/0109023 A1 | 4/2018 | Yun | |
| 2020/0301617 A1 * | 9/2020 | Kimura | H01R 12/724 |

* cited by examiner

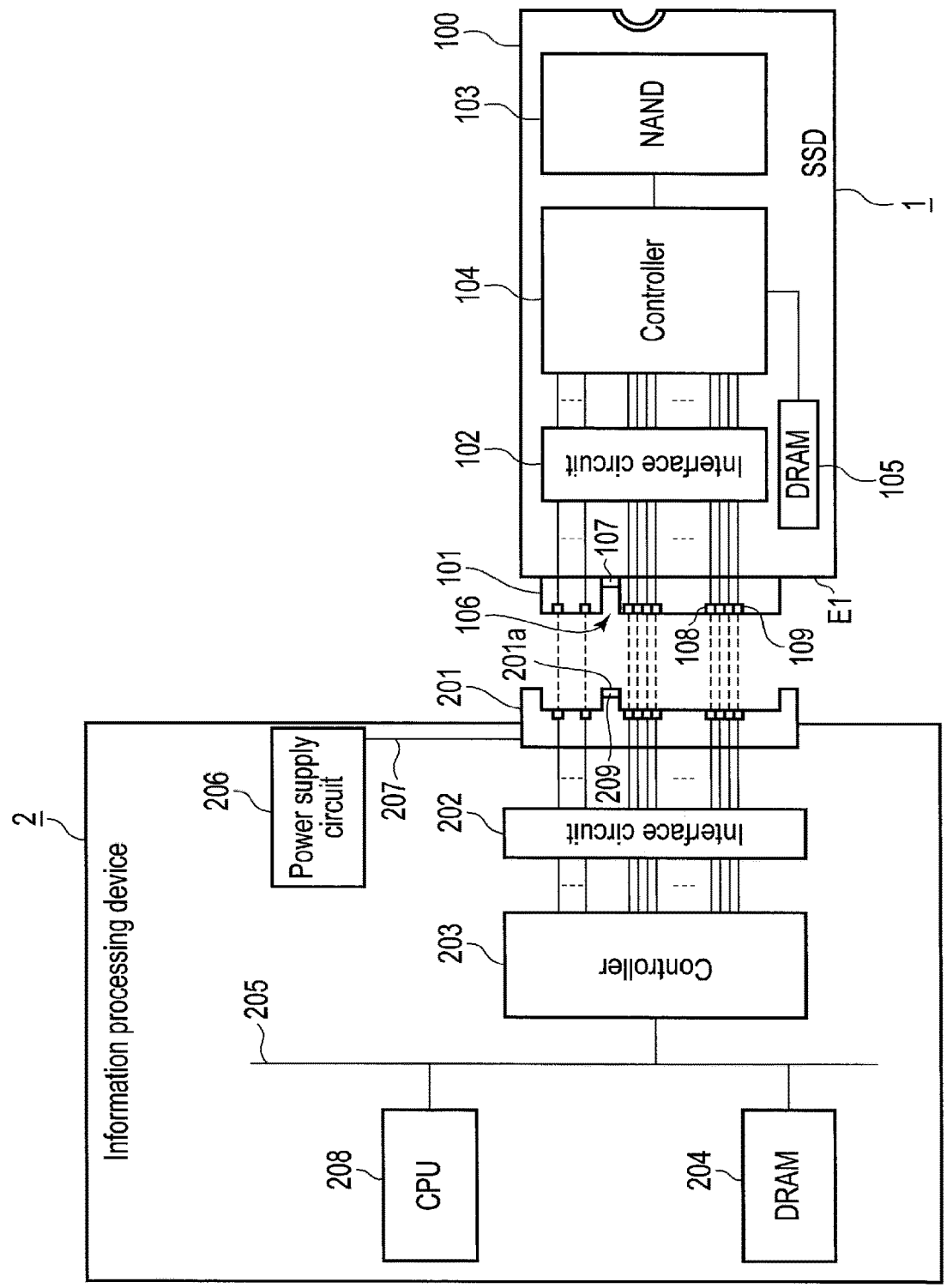
F I G. 1

| Key ID | Pin | Corresponding interface |
|---|---|---|
| A | 8-15 | PCIe×2, USB 2.0, $I^2C$, DP×4 |
| B | 12-19 | PCIe×2, SATA, USB 2.0 and 3.0, Audio, PCM, IUM, SSIC, $I^2C$ |
| C | 16-23 | Reserved for future use |
| D | 20-27 | Reserved for future use |
| E | 24-31 | PCIe×2, USB 2.0, $I^2C$, SDIO, UART, PCM |
| F | 28-35 | Future Memory Interface (FMI) |
| G | 39-46 | Custom use (not specified in the M.2 standard) |
| H | 43-50 | Reserved for future use |
| J | 47-54 | Reserved for future use |
| K | 51-58 | Reserved for future use |
| L | 55-62 | Reserved for future use |
| M | 59-66 | PCIe×4, SATA |

FIG. 3

| Pin | signal | signal | Pin |
|---|---|---|---|
| 74 | 3.3V | GND | 75 |
| 72 | 3.3V | GND | 73 |
| 70 | 3.3V | GND | 71 |
| | | PEDET (NC-PCIe) | 69 |
| 68 | SUSCLK(32kHz) (I)(0/3.3V) | NC | 67 |
| 66 | ADD_IN CARD KEY M | | |
| 64 | ADD_IN CARD KEY M | ADD_IN CARD KEY M | 65 |
| 62 | ADD_IN CARD KEY M | ADD_IN CARD KEY M | 63 |
| 60 | ADD_IN CARD KEY M | ADD_IN CARD KEY M | 61 |
| | | ADD_IN CARD KEY M | 59 |
| 58 | Reserved for MFG_CLOCK | GND | 57 |
| 56 | Reserved for MFG_DATA | | |
| 54 | PEWAKE# (I/O)(0/3.3V) | REFCLKp | 55 |
| 52 | CLKREQ# (I/O)(0/3.3V) | REFCLKn | 53 |
| 50 | PERST# (I)(0/3.3V) | GND | 51 |
| 48 | NC | PERp0 | 49 |
| 46 | NC | PERn0 | 47 |
| 44 | ALERT# (O)(0/1.8V) | GND | 45 |
| 42 | SMB_DATA (I/O)(0/1.8V) | PETp0 | 43 |
| 40 | SMB_CLK (I/O)(0/1.8V) | PETn0 | 41 |
| 38 | NC | GND | 39 |
| 36 | NC | PERp1 | 37 |
| 34 | NC | PERn1 | 35 |
| 32 | NC | GND | 33 |
| 30 | NC | PETp1 | 31 |
| 28 | NC | PETn1 | 29 |
| 26 | NC | GND | 27 |
| 24 | NC | PERp2 | 25 |
| 22 | NC | PERn2 | 23 |
| 20 | NC | GND | 21 |
| 18 | 3.3V | PETp2 | 19 |
| 16 | 3.3V | PETn2 | 17 |
| 14 | 3.3V | GND | 15 |
| 12 | 3.3V | PERp3 | 13 |
| 10 | LED_1# (O) | PERn3 | 11 |
| 8 | NC | GND | 9 |
| 6 | NC | PETp3 | 7 |
| 4 | 3.3V | PETn3 | 5 |
| 2 | 3.3V | GND | 3 |
| | | GND | 1 |

FIG. 7

|  |  | Soldered-down |  |  | Connectorized |  |  |
| --- | --- | --- | --- | --- | --- | --- | --- |
|  | Type | Module Height options | Pinout Key | Connector Key | Type | Module Height options | Module Key |
| Socket 1 Connectivity | 1216 | S1, S3 | E | N/A | N/A | N/A | N/A |
|  | N/A | N/A | N/A | A, E | 1630 | S1, D1, S3, D3, D4 | A, E, A+E |
|  | 2226 | S1, S3 | E | A, E | 2230 | S1, D1, S3, D3, D4 | A, E, A+E |
|  | 3026 | S1, S3 | A+E | A, E | 3030 | S1, D1, S3, D3, D4 | A, E, A+E |
| Socket 2 WWAN/Other | N/A | N/A | N/A | B | 3042 | S1, D1, S3, D3, D4 | B |
| Socket 2 SSD/Other | N/A | N/A | N/A | B | 2230 | S2, D2, S3, D3, D5 | B+M |
|  | N/A | N/A | N/A | B | 2242 | S2, D2, S3, D3, D5 | B+M |
|  | N/A | N/A | N/A | B | 2260 | S2, D2, S3, D3, D5 | B+M |
|  | N/A | N/A | N/A | B | 2280 | S2, D2, S3, D3, D5 | B+M |
|  | N/A | N/A | N/A | B | 22110 | S2, D2, S3, D3, D5 | B+M |
| Socket 3 SSD Drive | N/A | N/A | N/A | M | 2242 | S2, D2, S3, D3, D5 | M, B+M |
|  | N/A | N/A | N/A | M | 2260 | S2, D2, S3, D3, D5 | M, B+M |
|  | N/A | N/A | N/A | M | 2280 | S2, D2, S3, D3, D5 | M, B+M |
|  | N/A | N/A | N/A | M | 22110 | S2, D2, S3, D3, D5 | M, B+M |

FIG. 8

STORAGE DEVICE AND INFORMATION PROCESSING DEVICE

CROSS-REFERENCE TO RELATED APPLICATIONS

This application is based upon and claims the benefit of priority from Japanese Patent Application No. 2019-053087, filed Mar. 20, 2019, the entire contents of which are incorporated herein by reference.

FIELD

Embodiments described herein relate generally to a storage device and an information processing device.

BACKGROUND

A solid state drive (SSD) has been known as one of storage devices. The SSD is to be connected to an information processing device, such as a personal computer and server. The SSD is supplied with power from the information processing device in a state in which the SSD is connected to the information processing device.

BRIEF DESCRIPTION OF THE DRAWINGS

FIG. 1 is a schematic view showing structures of an SSD and an information processing device according to an embodiment of the invention.

FIG. 3 is a table showing a relationship between key IDs, pins, and corresponding interfaces.

FIG. 7 is a table showing an example of pin arrangement of the connectors according to an embodiment of the invention.

FIG. 8 is a diagram showing types of sockets 1 to 3 according to an embodiment of the invention.

DETAILED DESCRIPTION

Figure 2:
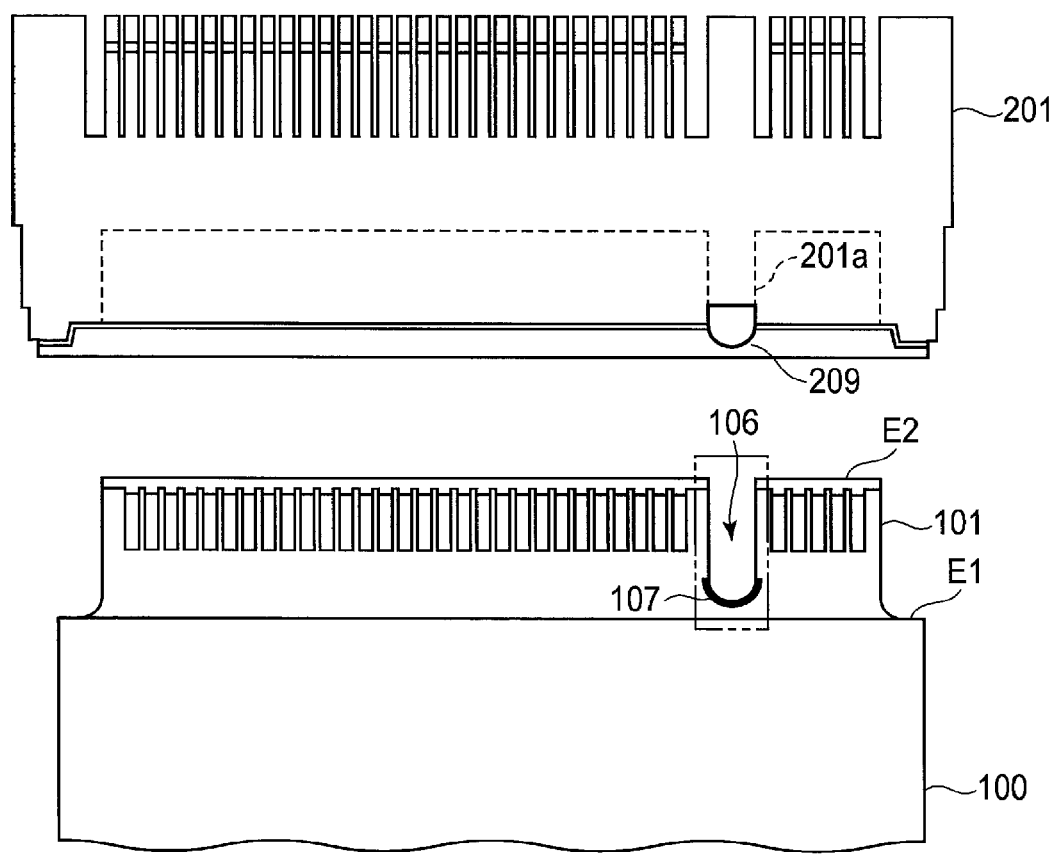
FIG. 2 is a plan view showing a connector of the SSD and a connector of the information processing device according to an embodiment of the invention.

In general, according to one embodiment, a storage device is disclosed. The storage device includes a substrate, a first connector provided on the substrate and including a notch, and a nonvolatile memory provided on the substrate. The storage device further includes a first conductive part provided on the first connector and being adjacent to the notch.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

FIG. 1 is a schematic view showing structures of an SSD 1 and an information processing device 2 according to an embodiment of the present invention.

In the present embodiment, description is given for a case where the information processing device 2 is a personal computer. However, the information processing device 2 is not limited to the personal computer, and may be, for example, a server, a tablet computer, a smart TV, or a satellite navigation system. Moreover, the forms of the information processing device according to the embodiment include a form in which the SSD is connected (or incorporated) in advance, and a form in which the SSD is not connected (or incorporated) but can be connected (or incorporated) later.

The SSD 1 comprises a printed circuit board 100, a connector (first connector) 101, an interface circuit 102, a NAND flash memory 103, a controller 104, and a dynamic random access memory (DRAM) 105. The connector 101, the interface circuit 102, the NAND flash memory 103, the controller 104, and the DRAM 105 are mounted on the printed circuit board 100.

The printed circuit board (substrate) 100 is a board including a printed circuit. The printed circuit is a circuit including a printed wiring and a component (for example, a resistor, a capacitor, or a transistor) mounted thereon.

The connector 101 is provided on one end part (first end part) E1 in a longitudinal direction of the printed circuit board 100. In the present embodiment, the connector 101 has a shape according to an M.2, which is one of the form factors, and is formed as an edge connector including power supply pins (first power supply pins) and signal pins (first signal pins). In FIG. 1, for the sake of simplification, only one power supply pin is denoted by reference symbol 108 and only one signal pin is denoted by reference symbol 109.

The interface circuit 102 is an interface conforming to the PCI Express (registered trademark) (PCIe) standard, which is one of the serial communication standards.

The NAND flash memory 103 is one of the nonvolatile memories storing data in a nonvolatile manner. The NAND flash memory 103 writes or reads data in units of a page including memory cells. A unique physical address is allocated to each page. The NAND flash memory 103 erases data in units of a block including pages. A plurality of NAND flash memories 103 (NAND flash memory chips) may be provided.

The controller 104 controls each of functional parts of the SSD 1 collectively.

The DRAM 105 is an example of a volatile memory, and used for a storage of management information of the NAND flash memory 103 or a cache of data, or the like.

The information processing device 2 comprises a connector 201, an interface circuit 202, a controller 203, a DRAM 204, a bus 205, a power supply circuit 206, a wiring 207, and a CPU 208. In the information processing device 2, the controller 203, the DRAM 204, and the CPU 208 are connected to each other via the bus 205.

The connector 201 is connectable to the connector 101. When the connector 201 is connected to the connector 101, the information processing device 2 is connected to the SSD 1. The interface circuit 202 performs interface processing to the SSD 1. In the present embodiment, the interface circuit 202 is an interface conforming to the PCIe standard. The controller 203 controls the interface circuit 202. The DRAM 204 is a memory element, and is used as a buffer when signals are transmitted and received between the information processing device 2 and the SSD 1. The power supply circuit 206 is a circuit which generates a voltage. In the present embodiment, the power supply circuit 206 generates an internal voltage based on power supplied from the outside of the information processing device 2. The wiring 207 connects the power supply circuit 206 and the connector 201. The CPU 208 controls each of parts of the information processing device 2, such as the controller 203 and the DRAM 204, collectively.

The SSD 1 is connectable to the information processing device 2. More specifically, the information processing device 2 comprises the connector (second connector) 201, and the connector 101 of the SSD 1 is connectable to the connector 201. In the present embodiment, the connector 101 is configured as an edge connector, so that the connector 201 of the information processing device 2 is configured as a socket corresponding to the edge connector. The connector 201 includes contacts (pinouts) corresponding to the power supply pins and the signal pins of the connector 101.

The connector 201 includes a key part (part fitted into a notch 106) 201a on which an extension power supply terminal (second conductive part) 209 is provided. The extension power supply terminal 209 will be described later.

The power supply circuit 206 and the interface circuit 202 are connected via the wiring 207. The interface circuit 202 is connected to the extension power supply terminal 209 via wiring (not shown for the sake of simplification). The number of power supply circuits may be two or more. Different power supply circuits supply power to different components.

The SSD 1 is supplied with power from the power supply circuit 206 of the information processing device 2 in a state in which the connector 101 of the SSD 1 is connected to the connector 201 of the information processing device 2.

The SSD 1 and the information processing device 2 may employ PCI Express (registered trademark) (PCIe), which is one of the serial communication standards, as a bus system. In this case, a logical interface used between the SSD 1 and the information processing device 2 is Advanced Host Controller Interface (AHCI). In addition, SATA may be employed instead of PCIe as a bus system. In this case, a logical interface used between the SSD 1 and the information processing device 2 is, for example, AHCI.

The controller 203 receives a command, data and the like from the CPU 208 via the bus 205. The controller 203 transmits the command, data and the like to the controller 104 of the SSD 1 via the interface circuit 202, the connector 201, the connector 101, and the interface circuit 102. The controller 104 writes data to the NAND flash memory 103 or reads data from the NAND flash memory 103 on the basis of the command, using the DRAM 105 as a buffer memory, and then transmits a response for the command to the controller 203. The controller 203 receives the response from the controller 104, and transmits the received response to the CPU 208 via the bus 205.

FIG. 2 is a plan view showing the connector (first connector) 101 of the SSD 1 and the connector (second connector) 201 of the information processing device 2. In FIG. 2, an edge connector having a key ID of M is illustrated. Reference symbol 106 represents a notch (recess or depression) whose position is determined according to the type of key ID. The notch 106 is recessed from an end part E2 toward the end part E1. The end part E2 represents an end part of the connector 101, which is opposed to the end part E1. A contour on the tip side (end part E1 side) of the notch 106 includes, for example, a U-shape as seen from above the printed circuit board 100.

Note that, the types of key ID include twelve types of A to M. FIG. 3 is a table showing a relationship between the key IDs, the pins, and the corresponding interfaces. In FIG. 3, the column "Pin" represents a region where a notch is formed. For example, when the notch is formed in a region of pin 8 to pin 15 and no pin exists in the region, the key ID is A. In addition, one edge connector may have two key IDs. In this case, the edge connector includes notches in two regions. For example, when an edge connector includes two key IDs of B and M, the edge connector includes notches in two regions which are a region of pin 12 to pin 19 and a region of pin 59 to pin 66.

Figure 4:
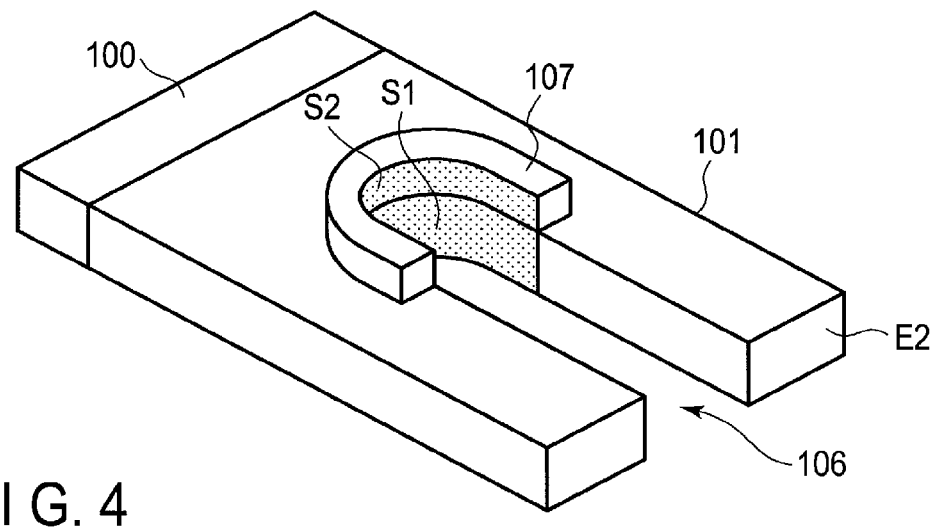
FIG. 4 is a perspective view showing an extension input terminal according to an embodiment of the invention.

FIG. 4 is a perspective view showing an extension input terminal according to an embodiment of the present invention. The perspective view of FIG. 4 is a perspective view of a region surrounded by alternate long and two short dashes lines of FIG. 2. An extension input terminal (first conductive part) 107 is provided on the connector 101 and is adjacent to the notch 106. The extension input terminal 107 is to be supplied with power (current, voltage).

In addition, as shown in FIG. 4, a side surface S1 (region hatched with dots) of the extension input terminal 107 and a side surface S2 (region hatched with dots) of the notch 106 under the side surface S1 form one surface (curved surface).

Note that, when a connector including two notches is used, two extension input terminals are used. That is, the number of extension input terminals is equal to the number of notches.

The extension input terminal 107 is a conductive member including a conductive material, for example, gold (Au). The conductive member is, for example, formed by plating. The dimensions and the shape of the extension input terminal 107 can be changed as appropriate, as long as the connector 101 is compatible with the M.2 standard.

The extension input terminal 107 is electrically connected to at least one of the components (for example, the NAND flash memory 103, the controller 104, and the DRAM 105) constituting the SSD 1 via wiring (not shown).

Figure 5:
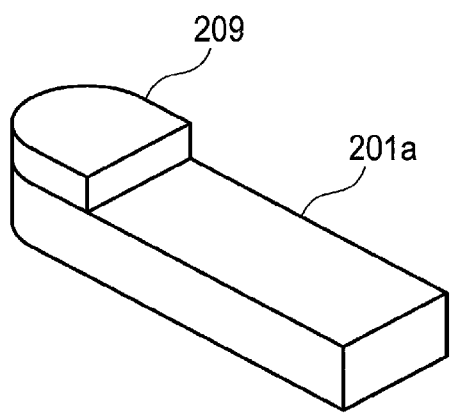
FIG. 5 is a perspective view showing an extension power supply terminal according to an embodiment of the invention.

FIG. 5 is a perspective view showing an extension power supply terminal according to an embodiment of the present invention. The extension power supply terminal 209 is an electrode provided on the key part 201a. For example, when the information processing device 2 is a personal computer, the connector 201 is provided on a motherboard of the information processing device 2. The dimensions and the shape of the extension power supply terminal 209 can be changed as appropriate, as long as the connector 201 (the key part 201a) is compatible with the M.2 standard.

Figure 6:
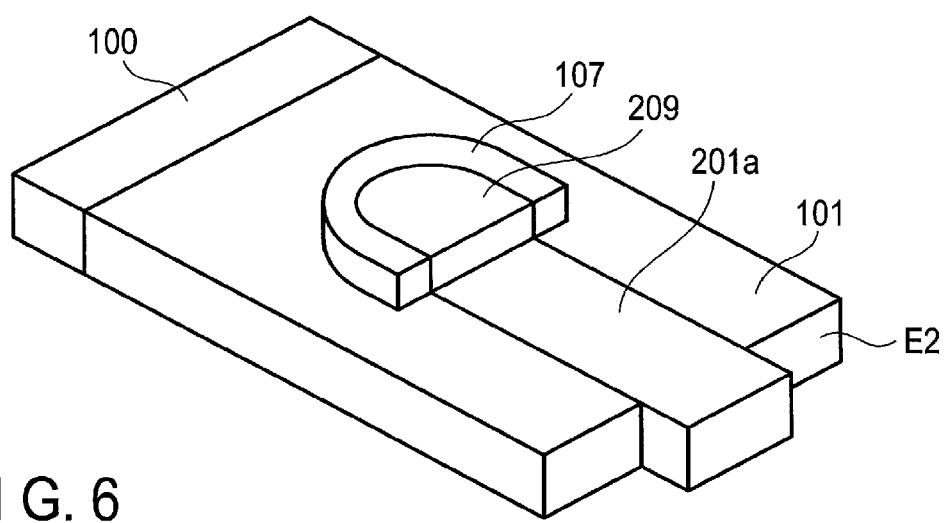
FIG. 6 is a perspective view showing the extension input terminal and the extension power supply terminal according to an embodiment of the invention.

FIG. 6 is a perspective view showing the extension input terminal and the extension power supply terminal according to an embodiment of the present invention. When the connector 101 is inserted into the connector 201, the extension input terminal 107 is connected to the extension power supply terminal 209.

FIG. 7 is a table showing an example of pin arrangement of the connector 201 (socket 3 [key M]) according to an embodiment of the present invention. Nine pins 2, 4, 12, 14, 16, 18, 70, 72, and 74 are allocated as power supply pins. These power supply pins are connected to the power supply circuit 206.

Here, a current that is permitted to flow through one power supply pin is 0.5 [A] at a maximum, so that the connector 201 employing the pin arrangement of FIG. 7 can supply the SSD with the current of 4.5 [A] at a maximum. The voltage that can be applied to the SSD is a voltage of 3.3 [V].

According to the current standards, the maximum current of the SSD is 2.5 [A]. In future, when the performance of PCIe has improved, the maximum current of the SSD may be changed to 3.5 [A] in continuousness and 6.0 [A] at peak. In order to achieve the changed maximum current, it is conceivable to, for example, reduce a contact resistance between a power supply pin of the connector of the SSD and the printed circuit board. However, it is difficult to reduce the contact resistance to the extent that the changed maximum current can be achieved.

Here, in the case of the embodiment of the present invention, the extension input terminal 107 of the SSD 1 and the extension power supply terminal 209 of the information processing device 2 are electrically connected in a state in which the connector 101 of the SSD 1 and the connector 201 of the information processing device 2 are connected. As a result, the extension input terminal 107 is also supplied with power from the power supply circuit 206 via the wiring 207, the extension power supply terminal 209, etc. Thus, in the SSD 1 according to the embodiment of the present embodiment, a current supplied from the information processing device 2 can be increased as compared to that in other SSDs which do not comprise the extension input terminal 107.

Therefore, the SSD 1 and the information processing device 2 according to the embodiment of the present invention are advantageous in that the maximum current can be increased with an improvement in the performance of PCIe in future while the SSD 1 and the information processing device 2 are compatible with the M.2 standard. Moreover, a similar advantage can be brought about also in a case where a foam factor of standards other than the M.2 standard is adopted and in a case where a bus system other than PCIe is adopted.

FIG. 8 is a diagram showing types of sockets 1 to 3 according to an embodiment of the present invention. The types of socket 3 include 2242, 2260, 2280, and 22110. In addition, the embodiment of the present invention is also applicable to socket 2, as well as socket 3. The types of socket 2 include 2230, 2242, 2260, 2280, and 22110.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a substrate;
a first connector part provided on the substrate and comprising a plurality of pins and a notch having a recess, the plurality of pins and the notch of the first connector part being compatible with a predetermined standard in shape;
a first conductive part provided on at least a bottom end of the recess of the notch and configured to receive power supplied from outside the storage device;
an interface circuit provided on the substrate and connected to the plurality of pins; and
a nonvolatile memory provided on the substrate and configured to store data received via the interface circuit.

2. The storage device of claim 1, wherein the substrate includes a first end part, and the first connector part is provided on the first end part.

3. The storage device of claim 2, wherein the notch is provided at a second end part of the first connector part and recessed from the second end part toward the first end part, and the second end part is opposed to the first end part.

4. The storage device of claim 1, wherein the first conductive part includes a plating layer.

5. The storage device of claim 1, wherein the first connector part and the first conductive part are connectable to an information processing device.

6. The storage device of claim 5, wherein:
the information processing device comprises a second connector and a second conductive part;
the first connector part is connectable to the second connector; and
the first conductive part is connectable to the second conductive part.

7. The storage device of claim 6, wherein the first connector part is supplied with power from the second connector and the first conductive part is supplied with power from the second conductive part in a state in which the first connector part is connected to the second connector and the first conductive part is connected to the second conductive part.

8. The storage device of claim 6, wherein:
the first connector part includes a first power supply pin and a first signal pin; and
the first power supply pin is supplied with power from the second connector.

9. The storage device of claim 1, wherein the first connector part conforms to an M.2 standard as the predetermined standard.

10. An information processing device connectable to a storage device which comprises a substrate, a first connector part provided on the substrate and comprising a plurality of first pins and a notch having a recess, the plurality of first pins and the notch of the first connector part being compatible with a predetermined standard in shape, a first conductive part provided on at least a bottom end of the notch and configured to receive power supplied from the information processing device, and a nonvolatile memory provided on the substrate,
the information processing device comprising:
a second connector comprising a plurality of second pins and a portion, the plurality of second pins being connectable to the plurality of first pins of the first connector part, the plurality of second pins and the portion of the second connector being compatible with the predetermined standard in shape;
a second conductive part provided on the portion of the second connector and being connectable to the first conductive part; and
a power supply circuit connected to the second conductive part.

11. The information processing device of claim 10, wherein the first connector part is connected to the second connector.

12. The storage device of claim 1, wherein:
the first connector part includes a first power supply pin; and
the power is supplied from outside the storage device via both the first power supply pin and the first conductive part.

* * * * *